United States Patent
Chen

(10) Patent No.: US 7,459,780 B2
(45) Date of Patent: Dec. 2, 2008

(54) FAN-OUT WIRE STRUCTURE

(75) Inventor: Wan-Jung Chen, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 11/399,344

(22) Filed: Apr. 7, 2006

(65) Prior Publication Data

US 2007/0052895 A1   Mar. 8, 2007

(30) Foreign Application Priority Data

Sep. 5, 2005   (TW) ............... 94130395 A

(51) Int. Cl.
*H01L 23/48* (2006.01)
(52) U.S. Cl. ....................... 257/695; 349/149
(58) Field of Classification Search ............... 257/695; 349/149

See application file for complete search history.

(56) References Cited

U.S. PATENT DOCUMENTS 7,113,246 B2   9/2006  Yamaguchi et al.
2005/0124093 A1*  6/2005  Yang et al. .............. 438/110

FOREIGN PATENT DOCUMENTS

CN   1632650 A   6/2005

* cited by examiner

*Primary Examiner*—W. David Coleman
(74) *Attorney, Agent, or Firm*—Rosenberg, Klein & Lee

(57) ABSTRACT

This invention discloses a fan-out wire structure for use in a display panel of a display device. The fan-out wire structure comprises a first metal layer, a first insulation layer, and a second metal layer. The first insulation layer is formed on the first metal layer and the second metal layer is formed on the first insulation layer, and the first metal layer and the second metal layer are electrically connected by a conductive material, so as to modulate the resistance of the fan-out wire structure by modulating the length of the second metal layer and the conductive material.

13 Claims, 7 Drawing Sheets

FAN-OUT WIRE STRUCTURE

FIELD OF THE INVENTION

The present invention relates to a fan-out wire structure and, more particularly, to a fan-out wire structure which is formed on a display panel of a display device.

BACKGROUND OF THE INVENTION

Referring to FIG. 1, a panel structure of a conventional display device is illustrated. The display device can be a liquid crystal display (LCD) device. The panel structure of the display device at least comprises a plurality of control wires 11, a plurality of fan-out wires 12, and a pin pad area 13. The plurality of control wires 11 are a parallel arrangement and are connected to a plurality of thin film transistors. The plurality of fan-out wires 12 is connected to the plurality of control wires 11 and the pad of the pin pad area 13. The pin pad area 13 is used to set on control integrated circuits, hence control signals sent by the control ICs are transmitted to the plurality of thin film transistors via the plurality of control wires 11 and the plurality of fan-out wires 12. Moreover, areas of the plurality of control wires 11 are greater than the pin pad area 13. The plurality of fan-out wires 12 are then formed a fan-shaped. A length of the most outer fan-out wire 121 is greater than a length of a middle fan-out wire 122. Therefore, a resistance of the most outer fan-out wire 121 is greater than a resistance of the middle fan-out wire 122, thereby generating a postponement difference when the control signal is transmitted to the thin film transistor. A mura, vertical band (V-band), and horizontal band (H-band) are generated from the images that seriously influence the display quality.

Referring to FIG. 2, another panel structure of a conventional display device is illustrated. The panel structure of the conventional display device is used to overcome shortcomings in FIG. 1. A width of the plurality of fan-out wires 21 is different. The width of the fan-out wires 21 which are near an outside is wider in order to reduce a resistance. On the other hand, the width of the fan-out wires 21 which are near middle is narrower in order to increase a resistance. The modulation is that the resistances of the plurality of the fan-out wires 21 tend toward consistency. However, the wire width is not controlled easily while is etching that cannot reach an expectation. The shape of the fan-out wire 21 can be changed so as to form a non-straight-line, such as fan-out wires 22, 23, and 24. By the fan-out wires 22, 23, and 24, the lengths of the fan-out wires 22, 23, and 24 tend toward consistency, in another word; resistances tend toward consistency. The forms of the fan-out wires 22, 23, and 24 are arbitrary shapes, thereby causing a difficult design. Areas are also too big that cannot reach the expectation as well.

Referring to FIG. 3, a third panel structure of a conventional display device is illustrated and is also used to overcome shortcomings in FIG. 1. A plurality of fan-out wires 31 comprise a first metal layer 311 and a second metal layer 312. A resistance of the first metal layer 311 and a resistance of the second metal layer 312 are different. A length ratio of the first metal layer 311 and a length ratio of the second metal layer 312 contained in the plurality of fan-out wires 31 are modulated, so that resistances of the plurality of fan-out wires tend toward consistency. Referring to FIG. 4, a sectional drawing of a conventional fan-out wire according to FIG. 3 is illustrated. The fan-out wire is formed on a panel 41 and is electrically connected to a control wire 42 and a pin pad 43. The first metal layer 311 and the second metal layer 312 are at the same height and are electrically connected to form a series structure. When the size of the display device is toward large-scale, an outer length of the fan-out wire is different from a middle length of the fan-out wire. In a conventional way, the first metal layer 311 and the second metal layer 312 are used to be the series connection for modulating length ratios, resistances of the plurality of fan-out wires 31 may not tend toward consistency. Consequently, the display quality is further decreased.

Referring to FIG. 5, another sectional drawing of a conventional fan-out wire structure is illustrated. The fan-out wire structure comprises a first metal layer 51 and a second metal layer 52. A material of the first metal layer 51 is different from a material of the second metal layer 52. The fan-out wire structure is formed on the panel 41 of the display device and is electrically connected to the control wire 42 and the pin pad 43. The second metal layer 52 is formed on the first metal layer 51. The second metal layer 52 is electrically connected to the first metal layer 51. Therefore, the second metal layer 52 is formed on a portion of the first metal layer 51. The second metal layer 52 is electrically conducted to the first metal layer 51. A resistance of the first metal layer 51 and a resistance of the second metal layer 52 are modulated when the length 521 of the second metal layer 52 is modulated. The resistances of the fan-out wire structure may not satisfy the modulation requirement from above conventional examples.

Accordingly, a solution must be provided to overcome the drawbacks and disadvantages in order to improve display quality by providing a fan-out wire structure.

SUMMARY OF THE INVENTION

The present invention provides a fan-out wire structure which is formed on a display panel. The fan-out wire structure comprises a first metal layer, a first insulation layer, and a second metal layer. The first insulation layer is formed on the first metal layer. The second metal layer is formed on the first insulation layer and is electrically connected to the first metal layer via a conductive material. The resistance of the fan-out wire structure can be modulated by modulating the length of the second metal layer and the conductive material.

The second object of the present invention is to provide a fan-out wire structure which is formed on a display panel. The fan-out wire structure comprises a first metal layer and a second metal layer. The first metal layer has at least one first contact window. The second metal layer is formed on the first metal layer and has at least one second contact window. The first metal layer and the second metal layer are non-overlapped. The first metal layer and the second metal layer are electrically connected to form a series structure via the first contact window and the second contact window. The resistance of the fan-out wire structure can be modulated by modulating the length of the first metal layer and the second metal layer.

Accordingly, the fan-out wire structure of the present invention can effectively resolve the resistance difference of the conventional fan-out wire structure, so as to improve display qualities of display panels.

Other features and advantages of the present invention and variations thereof will become apparent from the following description, drawings, and claims.

DETAILED DESCRIPTION OF THE PREFERRED EMBODIMENTS

Figure 1:
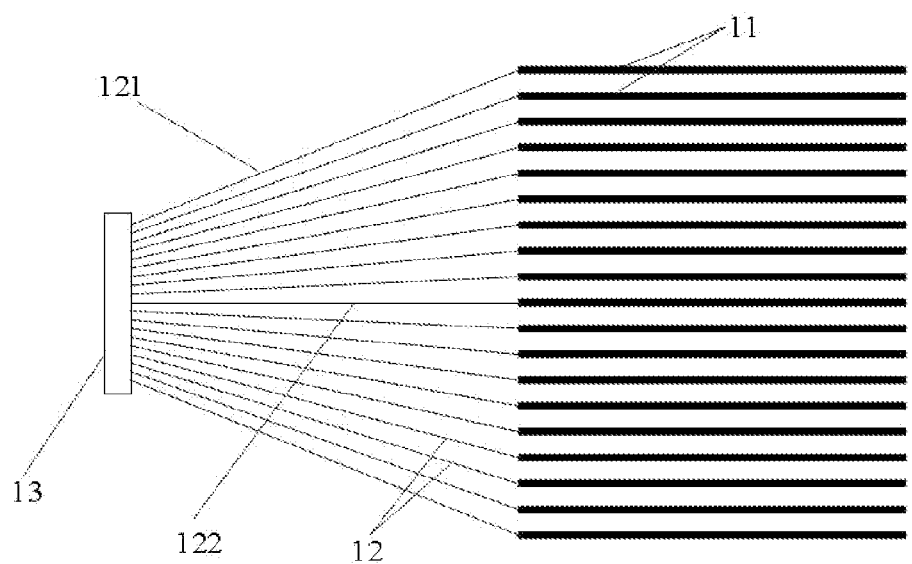
FIG. 1 is a schematic diagram of a panel structure of a conventional display device.
Figure 2:
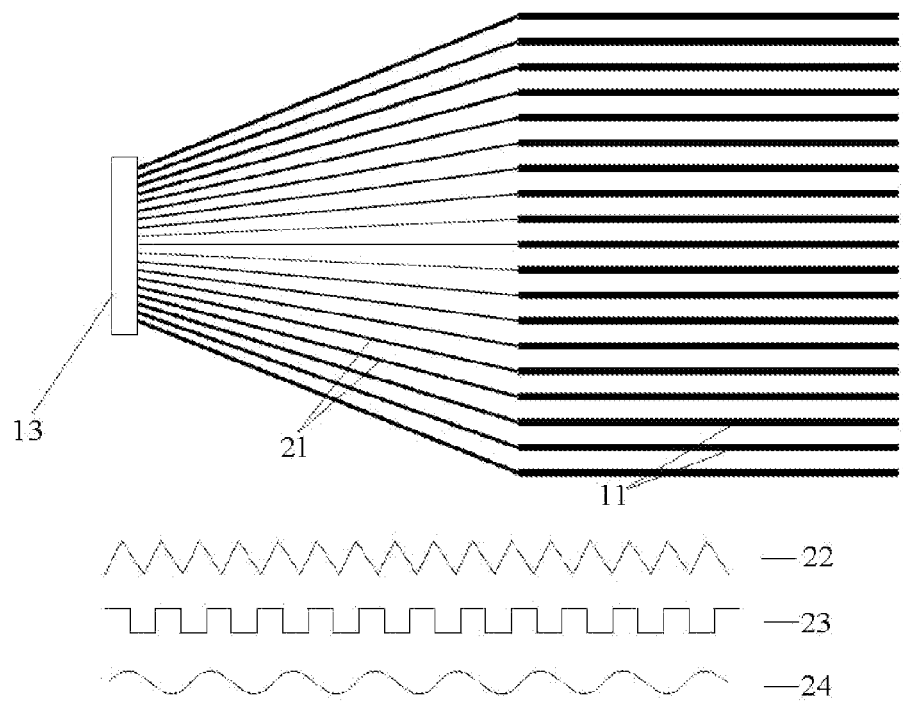
FIG. 2 is another panel structure of a conventional display device.
Figure 3:
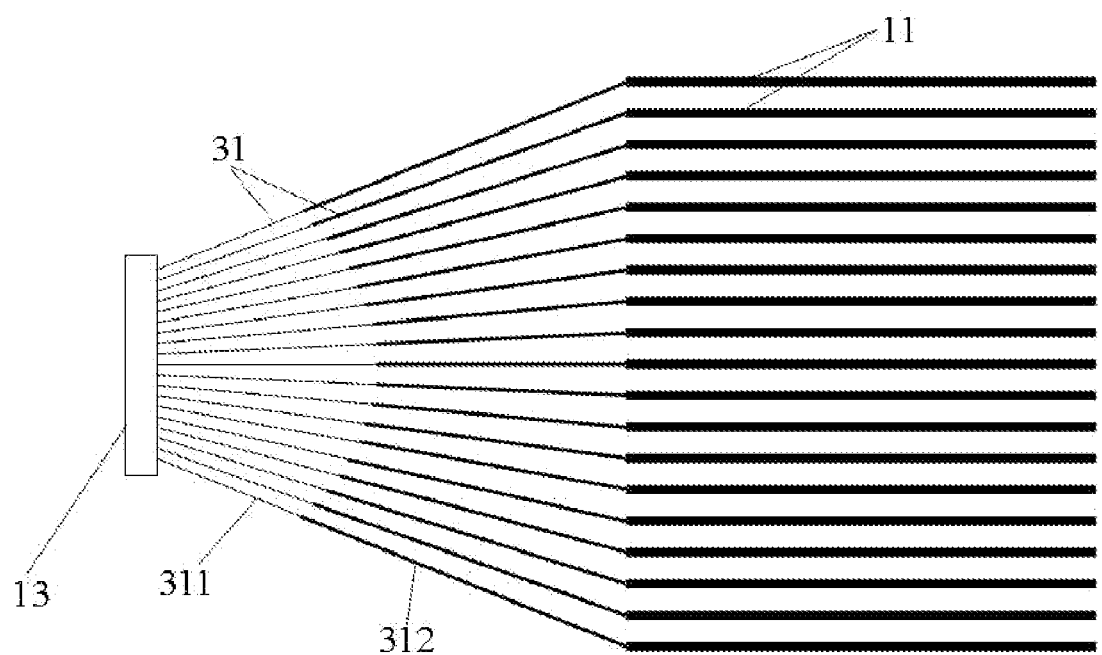
FIG. 3 is a third panel structure of a conventional display device.
Figure 4:
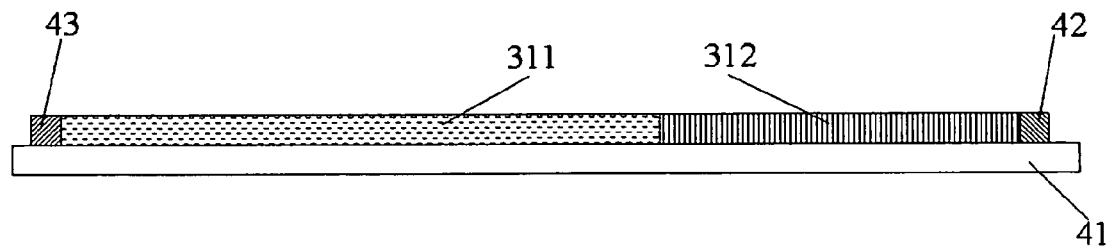
FIG. 4 is a sectional drawing of a conventional fan-out wire according to FIG. 3.
Figure 5:
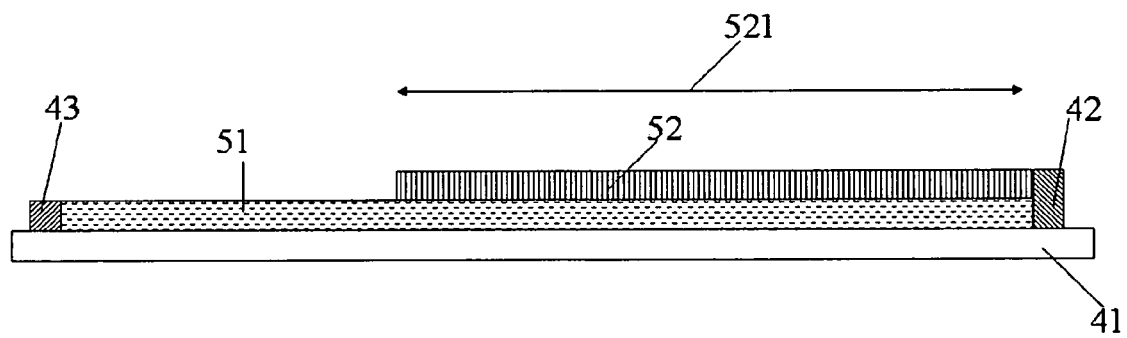
FIG. 5 is another sectional drawing of a conventional fan-out wire structure.
Figure 6:
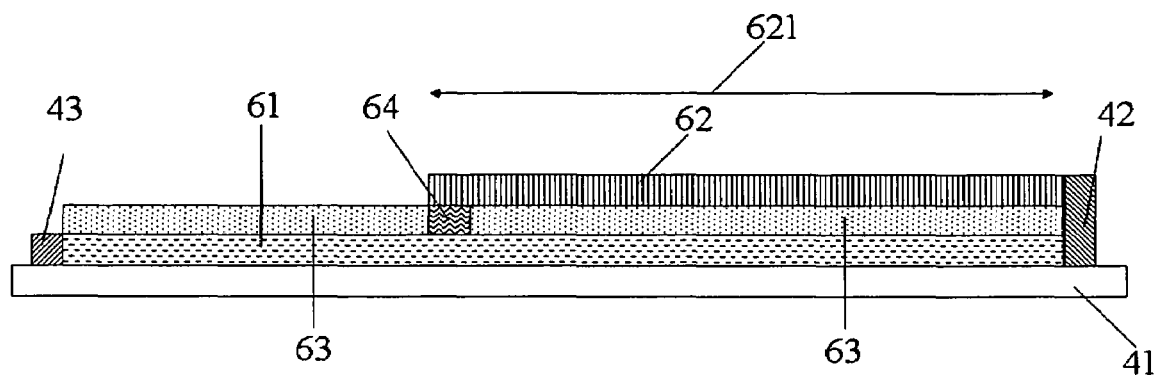
FIG. 6 is a sectional drawing of a fan-out wire structure according to an embodiment of the present invention.
Figure 7:
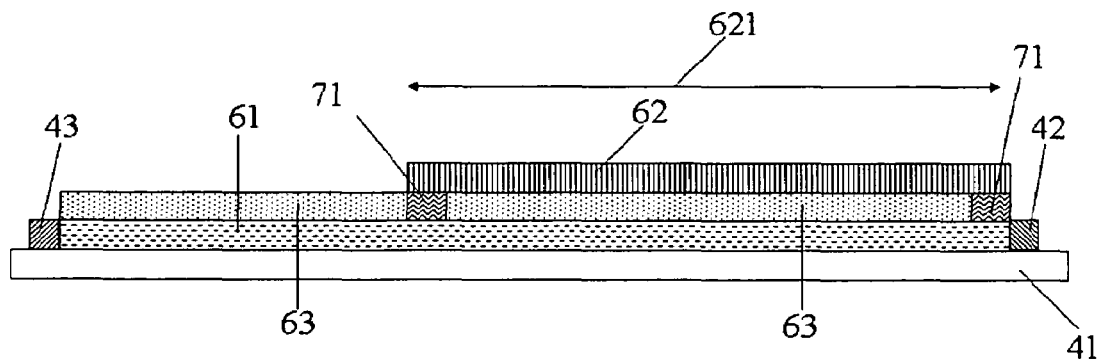
FIG. 7 is a sectional drawing of modifying the fan-out wire structure according to FIG. 6.
Figure 8:
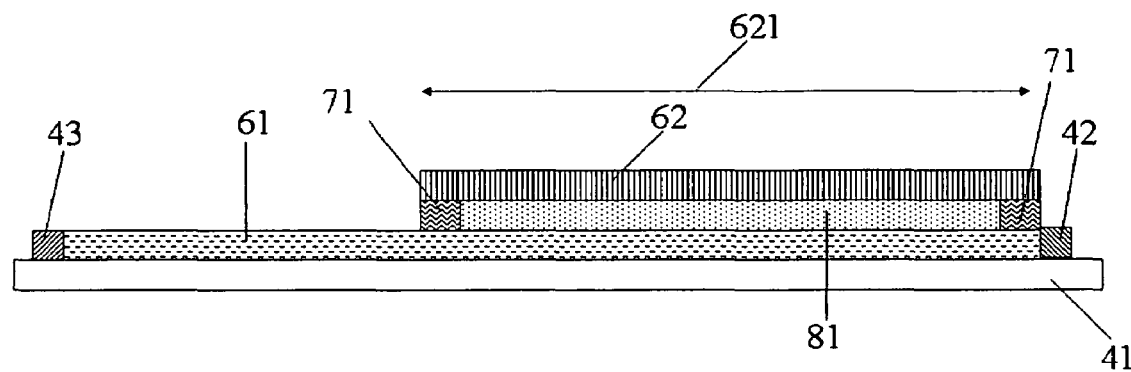
FIG. 8 is a sectional drawing of continuously modifying the fan-out wire structure according to FIG. 7.

Referring to FIG. 6, a sectional drawing of a fan-out wire structure according to an embodiment of the present invention is illustrated. The fan-out wire structure comprises a first metal layer 61, a second metal layer 62 and a first insulation layer 63. The first insulation layer 63 is formed between the first metal layer 61 and the second metal layer 62. The first insulation layer 63 has a first contact window 64, so the first metal layer 61 and the second metal layer 62 are electrically connected to compose a parallel connection structure via the first contact window 64. The first contact window 64 is further filled with a conductive material as the same as the second metal layer 62 or indium tin oxide (ITO) for electrically conduction. The resistance of the first metal layer 61 and the resistance of the second metal layer 62 can be modulated when a length 621 of the second metal layer 62 is modulated. In another word, the resistances of the fan-out wire structure can be modulated. Referring to FIG. 7, a sectional drawing of modifying the fan-out wire structure according to FIG. 6 is illustrated. The first insulation layer 63 has two first contact windows 71, so the first metal layer 61 and the second metal layer 62 are electrically connected to compose a parallel connection structure via the two first contact windows 71. The resistances of the fan-out wire structure can be modulated by modulating the length 621 of the second metal layer 62. Referring to FIG. 8, a sectional drawing of continuously modifying the fan-out wire structure according to FIG. 7 is illustrated. A first insulation layer 81 is formed on a portion of the fist metal layer 61. The first insulation layer 81 has two first contact windows 71, so the first metal layer 61 and the second metal layer 62 are electrically connected to compose a parallel connection structure via the two first contact windows 71. The resistances of the fan-out wire structure can be modulated by modulating the length 621 of the second metal layer 62.

Figure 9:
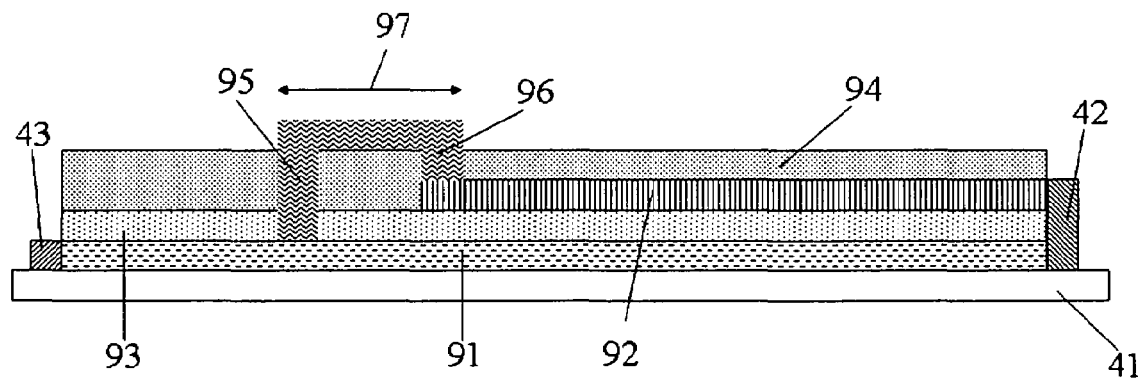
FIG. 9 is a sectional drawing of another fan-out wire structure according to an embodiment of the present invention.

Referring to FIG. 9, a sectional drawing of another fan-out wire structure according to an embodiment of the present invention is illustrated. The fan-out wire structure comprises a first metal layer 91, a second metal layer 92, a first insulation layer 93 and a second insulation layer 94. The first insulation layer 93 is formed between the first metal layer 91 and the second metal layer 92. The second insulation layer 94 is formed on the second metal layer 92. The first insulation layer 93 has a first contact window 95 and the first contact window 95 is electrically connected to the first metal layer 91. The second insulation layer 94 has a second contact window 96 and the second contact window 96 is electrically connected to the second metal layer 92. Moreover, the first contact window 95 is electrically connected to the second contact window 96, so that the first metal layer 91 and the second metal layer 92 are electrically connected to compose a parallel connection structure via the first contact window 95 and the second contact window 96. The first contact window 95 and the second contact window 96 are filled with a conductive material as indium tin oxide (ITO) for electrically conduction. The fan-out wire structure not only modulates the length of the second metal layer 92 so as to modulate the resistance of the fan-out wire structure, but modulates a distance 97 of a relative position between the first contact window 95 and the second contact window 96 so as to modulate the resistance of the fan-out wire structure.

Figure 10:
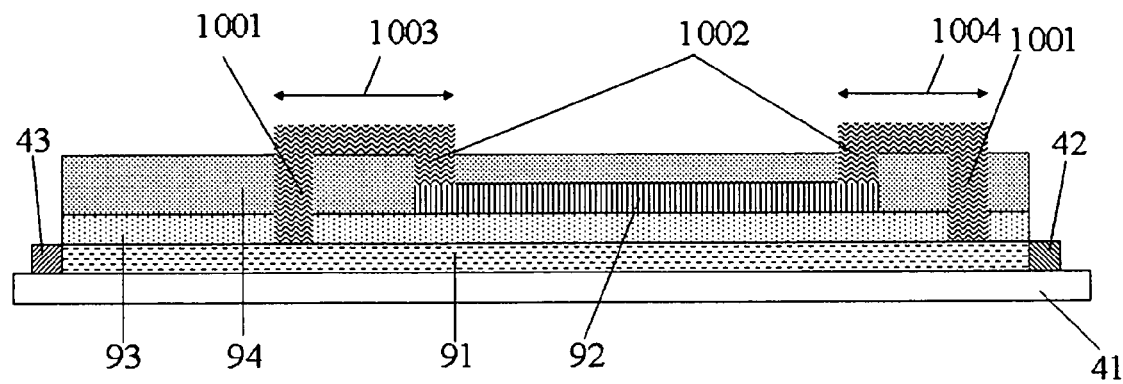
FIG. 10 is a sectional drawing of modifying the fan-out wire structure according to FIG. 9.
Figure 11:
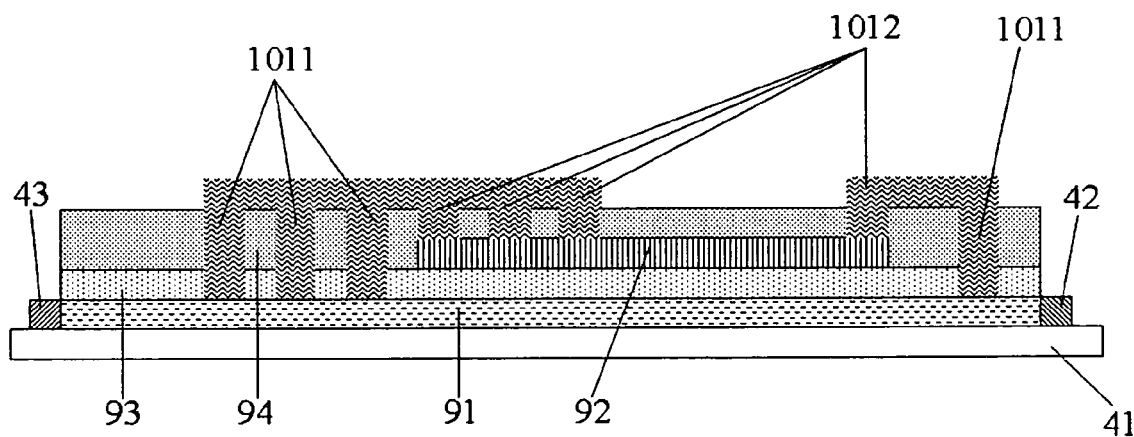
FIG. 11 is a sectional drawing of modifying the fan-out wire structure according to FIG. 10.

Referring to FIG. 10, a sectional drawing of modifying the fan-out wire structure according to FIG. 9 is illustrated. The first insulation layer 93 has two first contact windows 1001 and the two first contact windows 1001 are electrically connected to the first metal layer 91. The second insulation layer 94 has two second contact windows 1002 and the two second contact windows 1002 are electrically connected to the second metal layer 92. The first contact window 1001 and the second contact window 1002 are formed an electrically connection, so that the first metal layer 91 and the second metal layer 92 are also formed an electrically connection to compose a parallel connection structure via the first contact windows 1001 and the second contact windows 1002. The length of the second metal layer 92 or distances 1003 and 1004 of relative positions for the first contact windows 1001 and the second contact windows 1002 can also be modulated so as to modulate the resistance of the fan-out wire structure. Referring to FIG. 11, a sectional drawing of modifying the fan-out wire structure according to FIG. 10 is illustrated. The first insulation layer 93 has a plurality of first contact windows 1011, and the second insulation layer 94 has a plurality of second contact windows 1012. The resistance of the fan-out wire structure can be modulated by setting the number of the first contact windows 1011 and the second contact windows 1012.

Figure 12:
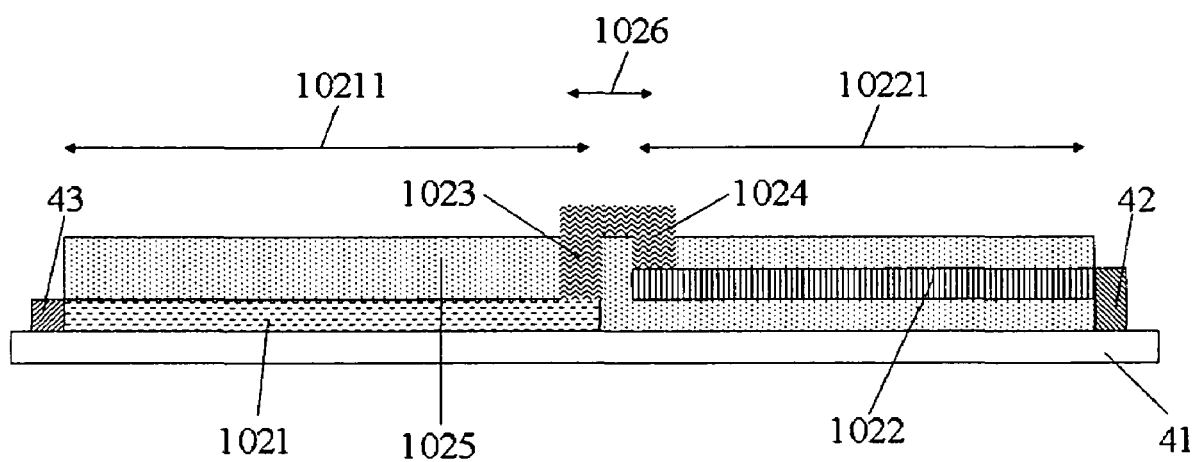
FIG. 12 is a sectional drawing of another fan-out wire structure according to an embodiment of the present invention.

Lastly, referring to FIG. 12, a sectional drawing of another fan-out wire structure according to an embodiment of the present invention is illustrated. The fan-out wire structure comprises a first metal layer 1021, a second metal layer 1022 and an insulation layer 1025. The first metal layer 1021 has a first contact window 1023. The second metal layer 1022 has a second contact window 1024. The second metal layer 1022 is formed on the first metal layer 1021 without overlapping. The insulation layer 1025 is set between the first metal layer 1021 and the second metal layer 1022. The first contact window 1023 and the second contact window 1024 are formed an electrically connection, so that the first metal layer 1021 and the second metal layer 1022 are electrically connected to compose a series structure via the first contact window 1023 and the second contact window 1024. The first contact window 1023 and the second contact window 1024 are filled with a conductive material as indium tin oxide (ITO) for electrically conduction. The length 10211 of the first metal layer 1021, the length 10221 of the second metal layer 1022, or a distance 1026 of a relative position between the first contact window 1023 and the second contact window 1024 can be modulated so as to modulate the resistance of the fan-out wire structure. The number for the first contact window 1023 and the second contact window 1024 can also be changed in order to modulate the resistance of the fan-out wire structure.

All fan-out wire structures of the mentioned above can be set on display panels, especially in the display panel of the liquid crystal device (LCD). The fan-out wire structure of the present invention can effectively overcome the resistance difference of conventional fan-out wire structures so as to improve display qualities of display devices.

Although the features and advantages of the embodiments according to the preferred invention are disclosed, it is not limited to the embodiments described above, but encompasses any and all modifications and changes within the spirit and scope of the following claims.

What is claimed is:

1. A fan-out wire structure for use in a display panel, comprising:
   a display panel fan-out wire structure, having;
   a first metal layer;
   a first insulation layer formed on the first metal layer; and
   a second metal layer formed on the first insulation layer and connected electrically to the first metal layer via a conductive material, wherein said first and second metal layers form a parallel electrical structure.

2. The structure of claim 1, wherein the first insulation layer is formed on a portion of the first metal layer.

3. The structure of claim 1, wherein the material of the first metal layer differs from the material of the second metal layer.

4. The structure of claim 1, wherein the conductive material comprises indium tin oxide (ITO).

5. The structure of claim 2, wherein the second metal layer is formed on a portion of the first insulation layer, and is electrically connected to the first metal layer through the conductive material.

6. The structure of claim 2, further comprising a second insulation layer formed on the second metal layer.

7. The structure of claim 5, wherein the first insulation layer has at least one first contact window, so that the conductive material is electrically connected to the first metal layer and the second metal layer via the at least one first contact window.

8. The structure of claim 6, further comprising:
   at least one first contact window formed in the first insulation layer, and electrically connected to the first metal layer via the conductive material; and at least one second contact window formed in the second insulation layer, and electrically connected to the second metal layer via the conductive material, wherein the at least one first contact window and the at least one second contact window are electrically connected together through the conductive material.

9. A fan-out wire structure for use in a display panel, comprising:
   a display panel fan-out wire structure, having;
   a first metal layer having at least one first contact window; and
   a second metal layer formed on the first metal layer, wherein the second metal layer and the first metal layer are non-overlapped, and the second metal layer has at least one second contact window, so that the first metal layer and the second metal layer are electrically connected in parallel, via the first contact window and the second contact window.

10. The structure of claim 9, wherein the material of the first metal layer differs from the material of the second metal layer.

11. The structure of claim 9, wherein the first contact window and the second contact window are filled with a conductive material for electrical conduction.

12. The structure of claim 11, wherein the conductive material comprises indium tin oxide (ITO).

13. A fan-out wire structure for use in a display panel, comprising:
   a display panel fan-out wire structure, having;
   a first metal layer;
   a first insulation layer formed on the first metal layer;
   a second metal layer formed on the first insulation layer; wherein the second metal layer and the first metal layer are non-overlapped;
   at least one first contact window included in the first insulation layer and electrically connected to the first metal layer;
   at least one second contact window included in the first insulation layer and electrically connected to the second metal layer; said first and second contact windows electrically connected each to the other; and wherein said first and second metal layers form a series electrical structure via the first and second contact windows.

* * * * *